US010376929B2

(12) United States Patent
Ishii et al.

(10) Patent No.: US 10,376,929 B2
(45) Date of Patent: Aug. 13, 2019

(54) APPARATUS AND METHOD FOR POLISHING A SURFACE OF A SUBSTRATE

(71) Applicant: EBARA CORPORATION, Tokyo (JP)

(72) Inventors: Yu Ishii, Tokyo (JP); Masayuki Nakanishi, Tokyo (JP); Keisuke Uchiyama, Tokyo (JP)

(73) Assignee: EBARA CORPORATION, Tokyo (JP)

( * ) Notice: Subject to any disclaimer, the term of this patent is extended or adjusted under 35 U.S.C. 154(b) by 91 days.

(21) Appl. No.: 15/647,829

(22) Filed: Jul. 12, 2017

(65) Prior Publication Data
US 2018/0015508 A1 Jan. 18, 2018

(30) Foreign Application Priority Data

Jul. 14, 2016 (JP) .................................. 2016-139777
Mar. 16, 2017 (JP) .................................. 2017-051673

(51) Int. Cl.
| | | |
|---|---|---|
| *B24B 37/013* | (2012.01) | |
| *B24B 37/10* | (2012.01) | |
| *B24B 37/30* | (2012.01) | |
| *B08B 1/04* | (2006.01) | |
| *B24B 37/04* | (2012.01) | |
| *H01L 21/687* | (2006.01) | |
| *H01L 21/304* | (2006.01) | |

(Continued)

(52) U.S. Cl.
CPC ................ *B08B 1/04* (2013.01); *B24B 7/228* (2013.01); *B24B 27/033* (2013.01); *B24B 37/013* (2013.01); *B24B 37/042* (2013.01); *B24B 37/10* (2013.01); *B24B 37/107* (2013.01); *B24B 37/30* (2013.01); *B24B 41/067* (2013.01); *B24B 49/08* (2013.01); *B24D 7/06* (2013.01); *H01L 21/304* (2013.01); *H01L 21/67051* (2013.01); *H01L 21/6875* (2013.01); *H01L 21/68728* (2013.01)

(58) Field of Classification Search
CPC ..... B24B 37/013; B24B 37/10; B24B 37/107; B24B 37/042; B24B 37/30; B24B 41/067; H01L 21/67051; H01L 21/68728; H01L 21/6875
USPC ...................... 451/10, 11, 41, 285, 397, 398
See application file for complete search history.

(56) References Cited

U.S. PATENT DOCUMENTS 6,379,235 B1 * 4/2002 Halley .................... B24B 9/065
451/287
6,461,224 B1 * 10/2002 Frost ..................... B24B 37/042
451/11

(Continued)

FOREIGN PATENT DOCUMENTS

| JP | 2015-012200 A | 1/2015 |
| WO | WO 2002/060643 A2 | 8/2002 |

OTHER PUBLICATIONS

European Patent Application No. 17181177.1; Extended Search Report; dated Jan. 2, 2018; 7 pages.

*Primary Examiner* — Eileen P Morgan
(74) *Attorney, Agent, or Firm* — Baker & Hostetler LLP (57) ABSTRACT

An apparatus which can polish an entirety of a surface of a substrate, such as a wafer, is disclosed. The apparatus includes a substrate holder configured to hold a substrate and rotate the substrate; and a polishing head configured to rub a polishing tool against a first surface of the substrate to polish the first surface. The substrate holder includes a plurality of rollers which can contact a periphery of the substrate. The plurality of rollers are rotatable about their respective own axes.

18 Claims, 7 Drawing Sheets

(51) Int. Cl.
*H01L 21/67* (2006.01)
*B24B 27/033* (2006.01)
*B24B 41/06* (2012.01)
*B24B 49/08* (2006.01)
*B24D 7/06* (2006.01)
*B24B 7/22* (2006.01)

(56) References Cited

U.S. PATENT DOCUMENTS

| | | | |
|---|---|---|---|
| 6,514,121 B1* | 2/2003 | Halley | B24B 9/065 451/269 |
| 6,517,419 B1* | 2/2003 | Halley | B24B 9/065 451/443 |
| 6,520,843 B1* | 2/2003 | Halley | B24B 9/065 451/285 |
| 6,629,874 B1* | 10/2003 | Halley | B24B 9/065 451/11 |
| 6,692,339 B1* | 2/2004 | Halley | B24B 37/042 451/41 |
| 2003/0073319 A1* | 4/2003 | Basol | B24B 37/013 438/692 |
| 2004/0048550 A1* | 3/2004 | Halley | B24B 9/065 451/5 |
| 2015/0000056 A1 | 1/2015 | Togawa et al. | |

\* cited by examiner

APPARATUS AND METHOD FOR POLISHING A SURFACE OF A SUBSTRATE

CROSS REFERENCE TO RELATED APPLICATIONS

This document claims priorities to Japanese Patent Application No. 2016-139777 filed Jul. 14, 2016 and Japanese Patent Application No. 2017-051673 filed Mar. 16, 2017, the entire contents of which are hereby incorporated by reference.

BACKGROUND

Devices, such as memory circuits, logic circuits and image sensors (e.g. CMOS sensors) are becoming more highly integrated these days. In a process for forming such devices, foreign matter such as fine particles and dust may ad here to the devices. Foreign matter adhering to a device can cause a short-circuit between interconnects or can cause a circuit failure. Therefore, in order to enhance the reliability of the device, it is necessary to clean a wafer on which the device is formed to remove the foreign matter on the wafer.

The above-described foreign matter, such as fine particles and dust, can may adhere also to a back surface (or a non-device surface) of a wafer. If such foreign matter adheres to the back surface of the wafer, the wafer can separate from or become inclined with respect to a stage reference surface of an exposure apparatus, resulting in patterning shift or focal distance shift. In order to prevent such problems, it is necessary to remove the foreign matter adhering to the back surface of a wafer.

A patterning device which uses nanoimprint technology instead of optical exposure technology has recently been developed. The nanoimprint technology involves pressing a patterning mold against a resin material that has been applied to a wafer, thereby transferring an interconnect pattern to the resin material. In order to avoid transfer of a contaminant between a die and a wafer or between wafers in such a nanoimprint process, it is necessary to remove foreign matter present on a surface of a wafer. In view of this, an apparatus has been proposed which rubs a polishing tool against a wafer under high load while supporting a lower side of the wafer with a high-pressure fluid, thereby slightly scraping away the surface of the wafer.

The conventional apparatus performs polishing of a wafer surface while rotating the wafer by using a substrate rotating mechanism (see, for example, Japanese Laid-open Patent Publication No. 2015-12200). The substrate rotating mechanism includes a plurality of chucks for gripping the periphery of the wafer, and an annular hollow motor for rotating the wafer through the chucks. The wafer is held horizontally by the chucks, and is rotated about its axis, along with the chucks, by the hollow motor. A polishing head provided with a polishing tool is disposed inwardly of the periphery of the wafer held by the chucks so that the polishing head will not contact the rotating chucks. As a result, the outermost area of the wafer surface cannot be polished, and needs to be polished separately by using an edge polishing apparatus.

The conventional apparatus is configured to terminate polishing of a substrate when a preset amount of time has elapsed. However, the amount of foreign matter varies from wafer to wafer. Therefore, constant-time polishing of wafers can cause excessive polishing and/or insufficient polishing of the wafers. More specifically, the foreign matter may remain on some wafers, while some wafers can be scraped more than necessary.

SUMMARY OF THE INVENTION

According to an embodiment, there is provided an apparatus and a method which can polish an entirety of a surface, including an outermost area thereof, of a substrate such as a wafer.

Embodiments, which will be described below, relate to an apparatus and a method for cleaning a surface of a substrate, such as a wafer.

In an embodiment, there is provided an apparatus comprising: a substrate holder configured to hold a substrate and rotate the substrate, the substrate holder including a plurality of rollers which can contact a periphery of the substrate and are rotatable about their respective own axes; and a polishing head configured to rub a polishing tool against a first surface of the substrate to polish the first surface.

In an embodiment, a sum of a distance from an axis of the polishing head to an outermost edge of the polishing tool and a distance from an axis of the substrate holder to the axis of the polishing head is longer than a radius of the substrate.

In an embodiment, the apparatus further comprises a roller-rotating mechanism configured to rotate the plurality of rollers about their respective own axes.

In an embodiment, the apparatus further comprises a substrate support stage configured to support a second surface of the substrate, the second surface being opposite from the first surface.

In an embodiment, the apparatus further comprises: a rinsing-liquid supply nozzle configured to supply a rinsing liquid to the first surface of the substrate; a particle counter configured to collect the rinsing liquid that has been supplied to the first surface of the substrate and measure the number of particles contained in the rinsing liquid; and an operation controller configured to determine an end point of polishing of the first surface of the substrate based on the number of particles.

In an embodiment, the end point of polishing is a point at which the number of particles becomes lower than a threshold value.

In an embodiment, there is provided a method comprising: rotating a substrate by rotating a plurality of rollers about their respective own axes while keeping the plurality of rollers in contact with a periphery of the substrate; and polishing a first surface of the substrate by rubbing a polishing tool against the first surface.

In an embodiment, during polishing of the first surface of the substrate, a part of the polishing tool comes outside the periphery of the substrate.

In an embodiment, a second surface of the substrate, opposite from the first surface, is supported during polishing of the first surface of the substrate.

In an embodiment, polishing the first surface comprises polishing the first surface of the substrate by rubbing the polishing tool against the first surface while supplying a rinsing liquid to the first surface. The method further comprises: collecting the rinsing liquid that has been supplied to the first surface of the substrate; measuring the number of particles contained in the rinsing liquid; and determining an end point of polishing of the first surface of the substrate based on the number of particles.

In an embodiment, the end point of polishing is a point at which the number of particles becomes lower than a threshold value.

According to an embodiment, there is provided an apparatus and a method which can polish a surface of a substrate while monitoring a surface condition of the substrate.

In an embodiment, there is provided an apparatus comprising: a substrate holder for holding a substrate and rotating the substrate; a polishing head for rubbing a polishing tool against a first surface of the substrate to polish the first surface; a rinsing-liquid supply nozzle for supplying a rinsing liquid to the first surface of the substrate; a particle counter for collecting the rinsing liquid that has been supplied to the first surface of the substrate and measuring the number of particles contained in the rinsing liquid; and an operation controller for determining an end point of polishing of the first surface of the substrate based on the number of particles.

In an embodiment, the end point of polishing is a point at which the number of particles becomes lower than a threshold value.

In an embodiment, the apparatus further comprises a substrate support stage for supporting a second surface, opposite from the first surface, of the substrate.

In an embodiment, the substrate holder includes a plurality of rollers which can contact the periphery of the substrate and are configured to be rotatable about their respective own axes.

In an embodiment, a sum of a distance from an axis of the polishing head to an outermost edge of the polishing tool and a distance from an axis of the substrate holder to the axis of the polishing head is longer than the radius of the substrate.

In an embodiment, the apparatus further comprises a roller-rotating mechanism for rotating the plurality of rollers about their respective own axes.

In an embodiment, there is provided a method comprising: polishing a first surface of a substrate by rubbing a polishing tool against the first surface of the substrate while rotating the substrate and supplying a rinsing liquid to the first surface of the substrate; collecting the rinsing liquid that has been supplied to the first surface of the substrate; measuring the number of particles contained in the rinsing liquid; and determining an end point of polishing of the first surface of the substrate based on the number of particles.

In an embodiment, the end point of polishing is a point at which the number of particles becomes lower than a threshold value.

In an embodiment, a second surface, opposite from the first surface, of the substrate is supported during the polishing of the first surface of the substrate.

In an embodiment, rotating the substrate comprises rotating a plurality of rollers about their respective own axes while keeping the rollers in contact with the periphery of the substrate.

In an embodiment, during polishing of the first surface of the substrate, the polishing tool partly comes outside the periphery of the substrate.

In an embodiment, there is provided a non-transitory computer-readable storage medium that stores a program for causing a computer to perform the steps of: instructing a substrate holder to hold a substrate and rotate the substrate; instructing a rinsing-liquid supply nozzle to supply a rinsing liquid to a surface of the substrate; instructing a polishing head assembly to rub a polishing tool against the surface of the substrate to polish the surface of the substrate in the presence of the rinsing liquid; instructing a particle counter to collect the rinsing liquid that has been supplied to the surface of the substrate and measure the number of particles contained in the rinsing liquid; receiving a data signal indicating the number of particles contained in the rinsing liquid; and determining an end point of polishing of the surface of the substrate based on the number of particles.

According to the above-described embodiments, when the polishing head is polishing the first surface of the substrate, the rollers, gripping the periphery of the substrate, rotate about their respective own axes. Therefore, there is no need to revolve the rollers around the center of the substrate along with the rotation of the substrate. Accordingly, the rollers do not contact the polishing head, and the polishing tool can polish the entirety of the first surface, including an outermost area thereof, of the substrate. As a result, there is no need to polish the outermost area of the surface of the substrate with use of an edge polishing apparatus, and hence the number of polishing steps can be reduced.

According to the above-described embodiments, the first surface of the substrate can be polished while measuring the amount of foreign matter removed. Therefore, the polishing of the substrate can be terminated when the amount of foreign matter removed reaches a low level. This makes it possible to finish a plurality of substrates, having different initial amounts of foreign matter, into a uniform surface state. Furthermore, the above-described reference examples can prevent a decrease in the throughput, an excessive consumption of the polishing tool, an increase in polishing marks on a substrate, worsening of the polishing profile, etc. due to excessive polishing. A decrease in the yield due to insufficient polishing can also be prevented.

DESCRIPTION OF EMBODIMENTS

Embodiments will now be described with reference to the drawings.

Figure 1:
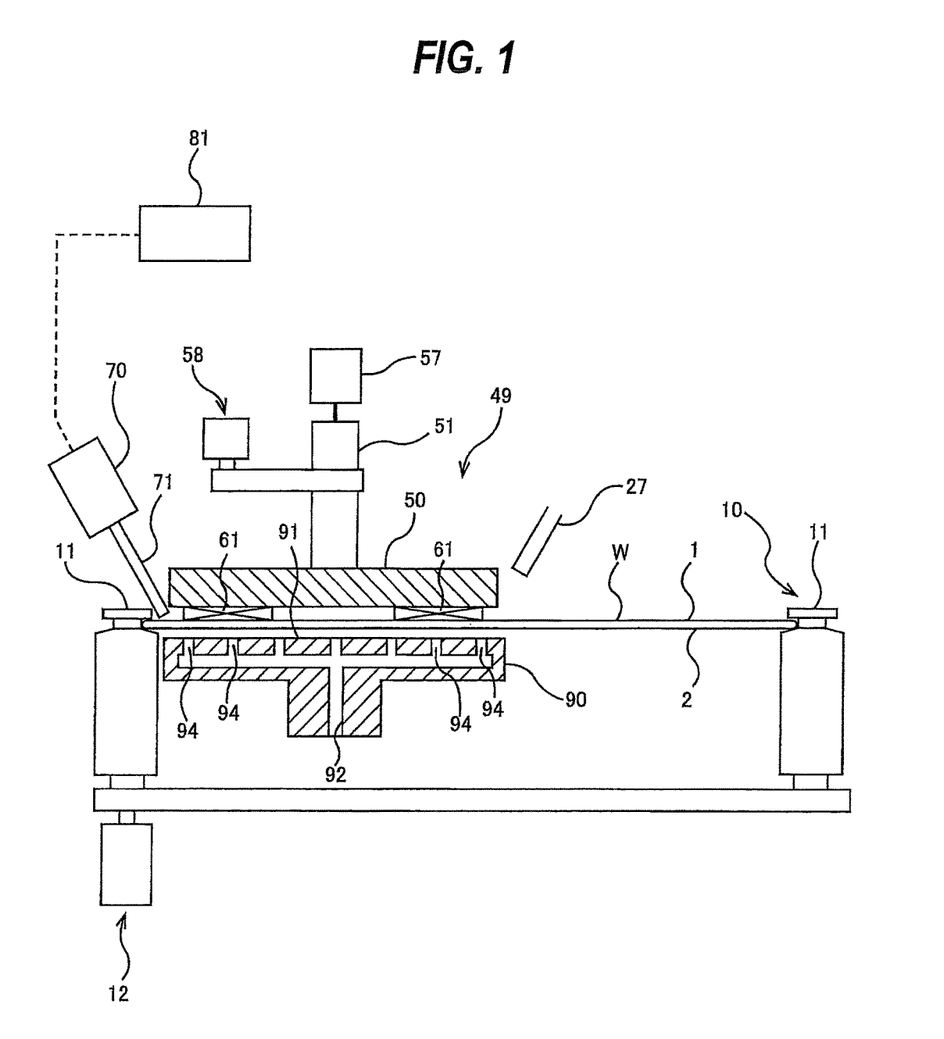
FIG. 1 is a schematic view showing an embodiment of a polishing apparatus.

FIG. 1 is a schematic view showing an embodiment of a polishing apparatus. The polishing apparatus includes a substrate holder 10 for holding a wafer W, which is an example of a substrate, and rotating the wafer W about its axis, a polishing head assembly 49 for polishing a first surface 1 of the wafer W, held by the substrate holder 10, to remove foreign matter, scratches, etc. from the first surface 1 of the wafer W, and a hydrostatic support stage 90 as a substrate support stage for supporting a second surface 2 of the wafer W which is opposite from the first surface 1. The polishing head assembly 49 is disposed above the wafer W held by the substrate holder 10, while the hydrostatic support stage 90 is disposed below the wafer W held by the substrate holder 10.

In one embodiment, the first surface 1 of the wafer W is a back surface of the wafer W with no device formed thereon, i.e., a non-device surface, while the opposite second surface 2 of the wafer W is a surface on which devices are formed, i.e., a device surface. In one embodiment, the first surface 1 of the wafer W may be the device surface, while the second surface 2 of the wafer W may be the back surface of the wafer W on which no device is formed. A silicon surface is an example of the back surface with no device formed on. In this embodiment, the wafer W is held by the substrate holder 10 horizontally with the first surface 1 facing upward.

The substrate holder 10 includes a plurality of rollers 11 which can contact the periphery of the wafer W, and a roller-rotating mechanism 12 for rotating the rollers 11 about their respective own axes. In this embodiment, four rollers 11 are provided. Five or more rollers 11 may be provided. In one embodiment, the roller-rotating mechanism 12 includes a motor, a belt, pulleys, etc. The roller-rotating mechanism 12 is configured to rotate the four rollers 11 at the same speed in the same direction. During polishing of the first surface 1 of the wafer W, the periphery of the wafer W is held by the rollers 11. The wafer W is held horizontally, and is rotated about its axis by the rotations of the rollers 11.

Figure 2:
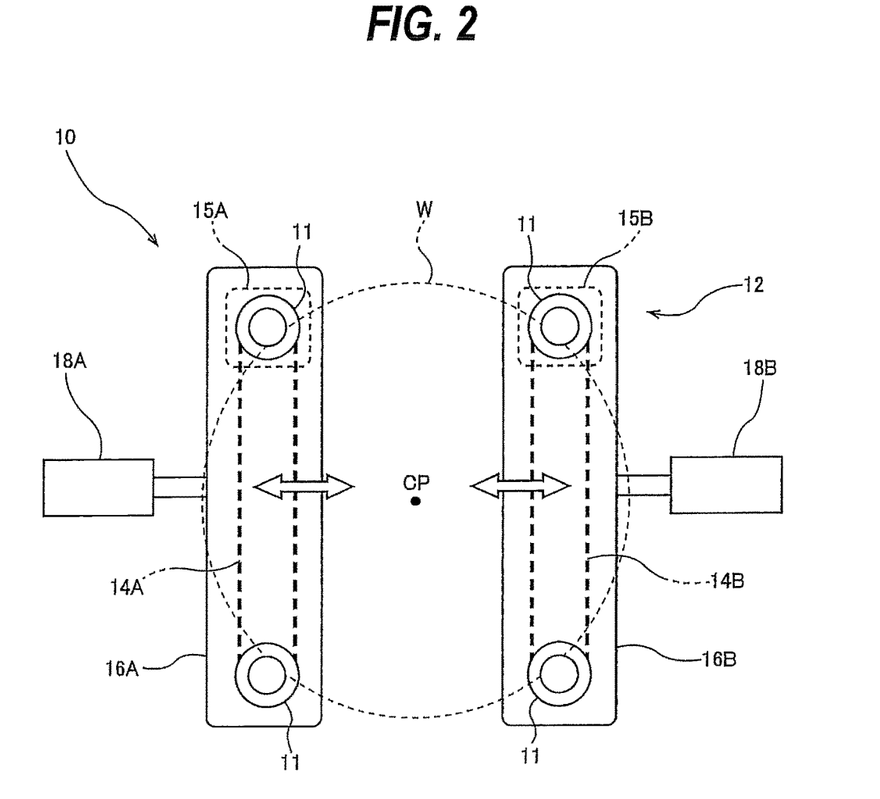
FIG. 2 is a plan view showing details of a roller-rotating mechanism.

FIG. 2 is a plan view showing details of the roller-rotating mechanism 12. The roller-rotating mechanism 12 includes a first belt 14A coupling two of the four rollers 11, a first motor 15A coupled to one of the two rollers 11 coupled by the first belt 14A, a first roller base 16A that rotatably supports the two rollers 11 coupled by the first belt 14A, a second belt 14B coupling the other two of the four rollers 11, a second motor 15B coupled to one of the two rollers 11 coupled by the second belt 14B, and a second roller base 16B that rotatably supports the two rollers 11 coupled by the second belt 14B.

The first motor 15A and the first belt 14A are disposed below the first roller base 16A, and the second motor 15B and the second belt 14B are disposed below the second roller base 16B. The first motor 15A and the second motor 15B are secured to the lower surface of the first roller base 16A and the lower surface of the second roller base 16B, respectively. A not-shown pulley is secured to a lower portion of each of the rollers 11. The first belt 14A rides on pulleys secured to two of the four rollers 11, and the second belt 14B rides on pulleys secured to the other two rollers 11. The first motor 15A and the second motor 15B are configured to rotate at the same speed in the same direction. Therefore, the four rollers 11 can rotate at the same speed in the same direction.

The roller-rotating mechanism 12 further includes a first actuator 18A coupled to the first roller base 16A, and a second actuator 18B coupled to the second roller base 16B. The first actuator 18A is configured to move the two rollers 11, supported by the first roller base 16A, in a horizontal direction as shown by arrow. Similarly, the second actuator 18B is configured to move the other two rollers 11, supported by the second roller base 16B, in a horizontal direction as shown by arrow. Specifically, the first actuator 18A and the second actuator 18B are configured to move the two pairs of rollers 11 (each pair comprising two rollers 11 in this embodiment) in directions closer to and away from each other. The first actuator 18A and the second actuator 18B may each be comprised of an air cylinder, a motor-driven actuator, or the like. In the embodiment shown in FIG. 2, the first actuator 18A and the second actuator 18B are each comprised of an air cylinder. When the two pairs of rollers 11 move closer to each other, the wafer W is held by the four rollers 11. When the two pairs of rollers 11 move away from each other, the wafer W is released from the four rollers 11. In this embodiment, the four rollers 11 are arranged around an axis CP of the substrate holder 10. It is noted that the number of rollers 11 is not limited to four. For example, it is possible to arrange three rollers 11 around the axis CP at regular angular intervals of 120 degrees, and to provide an actuator for each one of the rollers 11.

Figure 3:
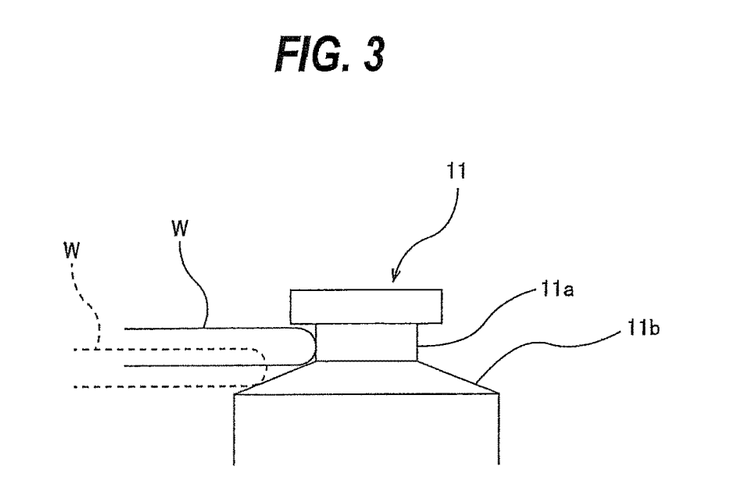
FIG. 3 is an enlarged view of an upper portion of a roller.

FIG. 3 is an enlarged view of an upper portion of the roller 11. Each roller 11 has a clamp portion 11a having a cylindrical holding surface, and a tapered surface 11b connected to the clamp portion 11a and inclined downwardly from the clamp portion 11a. The tapered surface 11b has a shape of a truncated cone, and has a larger diameter than that of the clamp portion 11a. The wafer W is first placed on the tapered surfaces 11b of the rollers 11 by a not-shown transport device. Subsequently, the rollers 11 move toward the wafer W, whereby the periphery of the wafer W is held by the clamp portions 11a. When the wafer W is to be released from the rollers 11, the rollers 11 move away from the wafer W, whereby the periphery of the wafer W is separated from the clamp portions 11a and is supported on the tapered surfaces 11b (see the dotted line of FIG. 3). The not-shown transport device can remove the wafer W from the tapered surfaces 11b.

Figure 4:
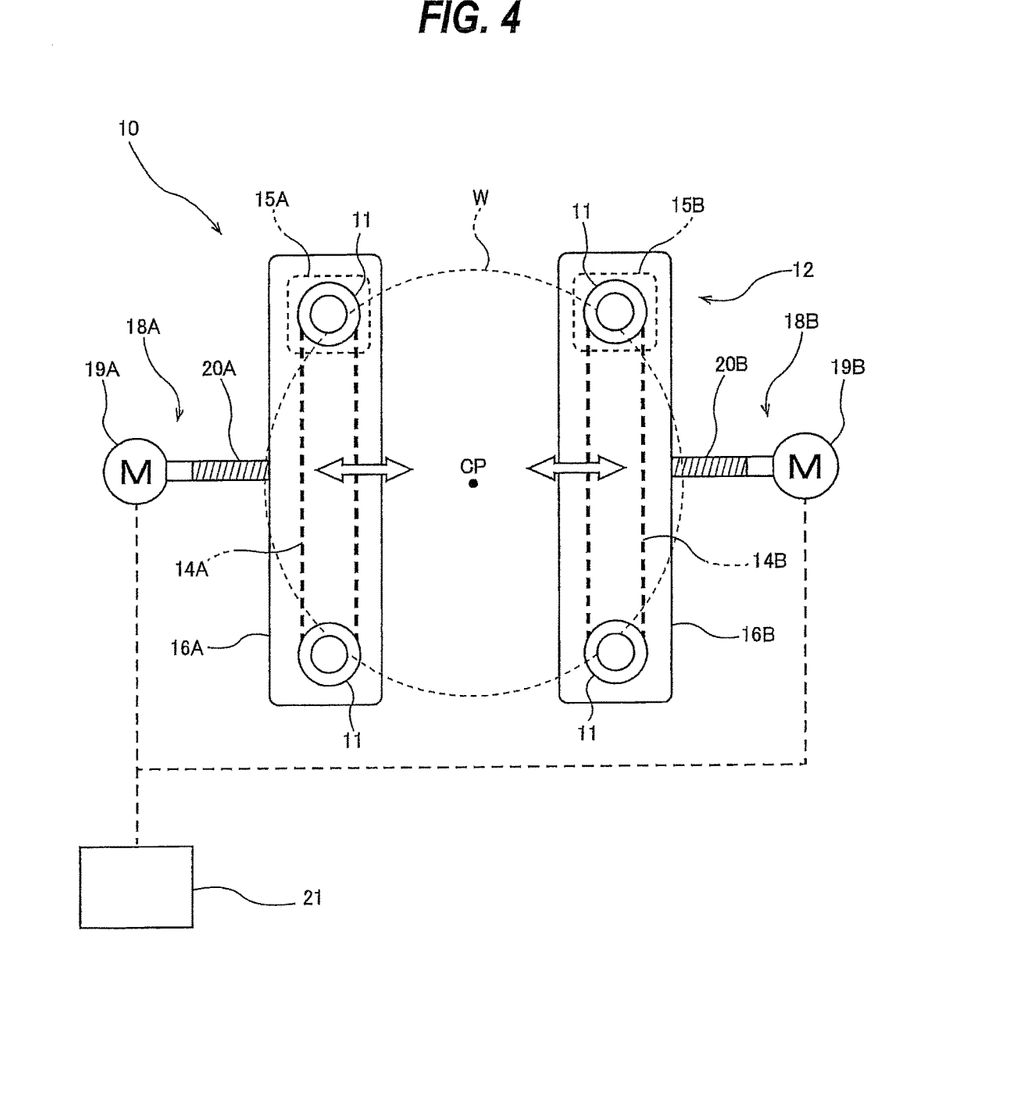
FIG. 4 is a diagram showing an embodiment in which a first actuator and a second actuator are each comprised of a motor-driven actuator.

FIG. 4 is a diagram showing an embodiment in which the first actuator 18A and the second actuator 18B are each comprised of a motor-driven actuator. The first actuator 18A includes a first servo motor 19A, and a first ball screw mechanism 20A coupled to the first roller base 16A. The second actuator 18B includes a second servo motor 19B, and a second ball screw mechanism 20B coupled to the second roller base 16B. The servo motors 19A and 19B are coupled to the ball screw mechanisms 20A and 20B, respectively. When the servo motors 19A, 19B drive the ball screw mechanisms 20A, 20B, the two pairs of rollers 11 move in directions closer to and away from each other.

The servo motors 19A, 19B are electrically connected to an actuator controller 21. By controlling the operations of the servo motors 19A, 19B, the actuator controller 21 can precisely control the positions of the rollers 11 during polishing of the wafer W. In this embodiment, the four rollers 11 are arranged around the axis CP of the substrate holder 10; however, the number of rollers 11 is not limited to four. For example, it is possible to arrange three rollers 11 around the axis CP at regular angular intervals of 120 degrees, and to provide an actuator for each one of the rollers 11.

A rinsing-liquid supply nozzle 27 for supplying a rinsing liquid (e.g., pure water) to the first surface 1 of the wafer W is disposed above the wafer W held by the substrate holder 10. The rinsing-liquid supply nozzle 27 is coupled to a not-shown rinsing-liquid supply source. The rinsing-liquid supply nozzle 27 is directed at the center of the wafer W. The rinsing liquid is supplied from the rinsing-liquid supply nozzle 27 to the center of the wafer W, and spreads over the first surface 1 of the wafer W due to the centrifugal force generated by the rotating wafer W.

The polishing head assembly 49 includes a polishing head 50 for polishing the first surface 1 of the wafer W, held by the substrate holder 10, to remove foreign matter, scratches, etc. from the first surface 1 of the wafer W. The polishing head 50 is coupled to a head shaft 51. This head shaft 51 is coupled to a head-rotating mechanism 58 for rotating the polishing head 50 about its axis. The head shaft 51 is further coupled to an air cylinder 57 as a load applying device for applying a downward load to the polishing head 50. The polishing head 50 has a plurality of polishing tools 61 for polishing the first surface 1 of the wafer W. The lower surface of the polishing head 50 is a polishing surface constituted by the polishing tools 61. The polishing head assembly 49 includes at least the polishing head 50, the head shaft 51, the head-rotating mechanism 58, and the air cylinder 57. In one embodiment, the head-rotating mechanism 58 has a known construction comprising a motor, a belt, pulleys, etc.

In this embodiment, the polishing tools 61 are each comprised of a polishing tape having one surface constituted by a polishing layer containing abrasive particles. Both ends of the polishing tape are held by two not-shown reels disposed in the polishing head 50, and the lower surface of the polishing tape extending between the two reels can contact the first surface 1 of the wafer W. In one embodiment, each polishing tool 61 may be comprised of a sponge, a non-woven fabric, a foamed polyurethane, or a fixed-abrasive material.

Figure 5:
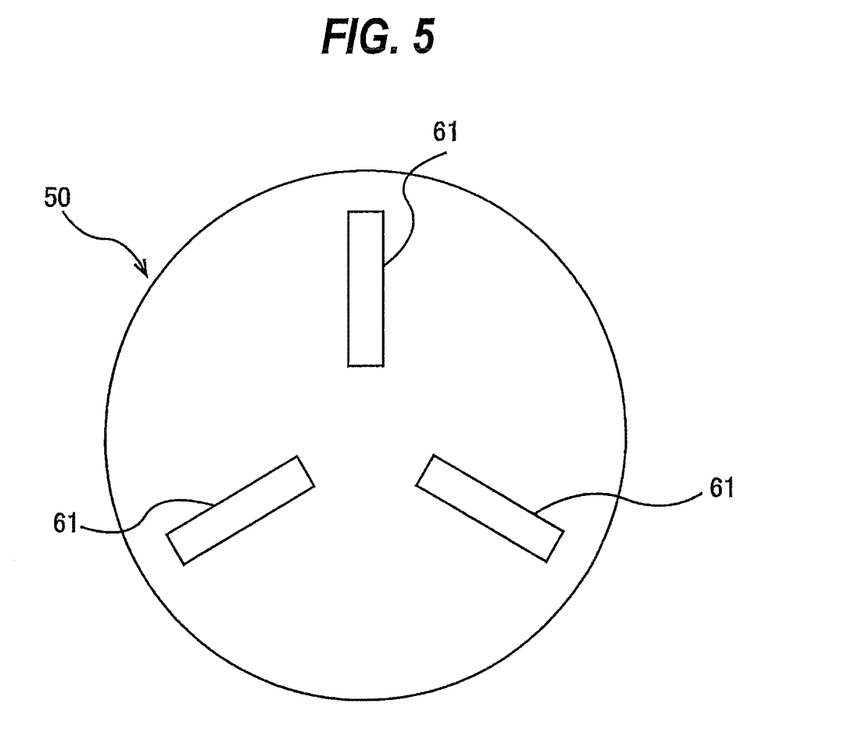
FIG. 5 is a bottom view of a polishing head.

FIG. 5 is a bottom view of the polishing head 50. As shown in FIG. 5, the polishing tools 61 extend in the radial directions of the polishing head 50 and are arranged at regular intervals around the axis of the polishing head 50. The polishing head 50, while rotating about its axis, rubs the polishing tools 61 against the first surface 1 of the wafer W to polish the first surface 1.

Figure 6:
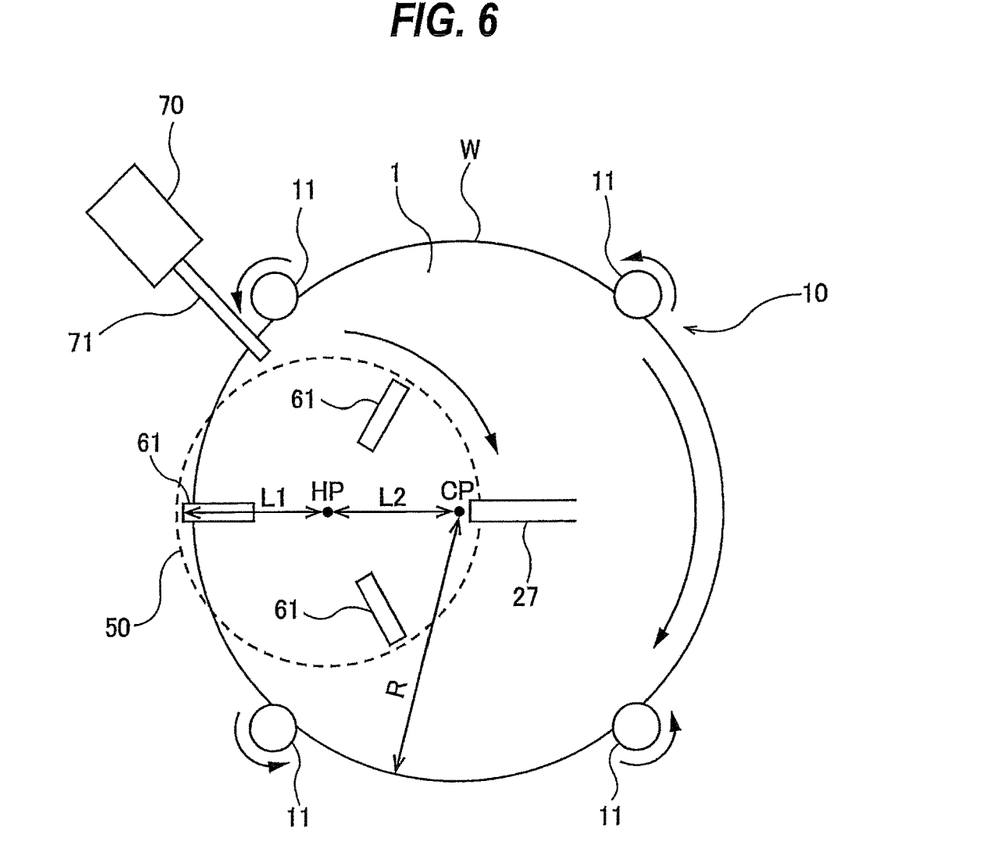
FIG. 6 is a plan view showing an arrangement of the polishing head.
Figure 7:
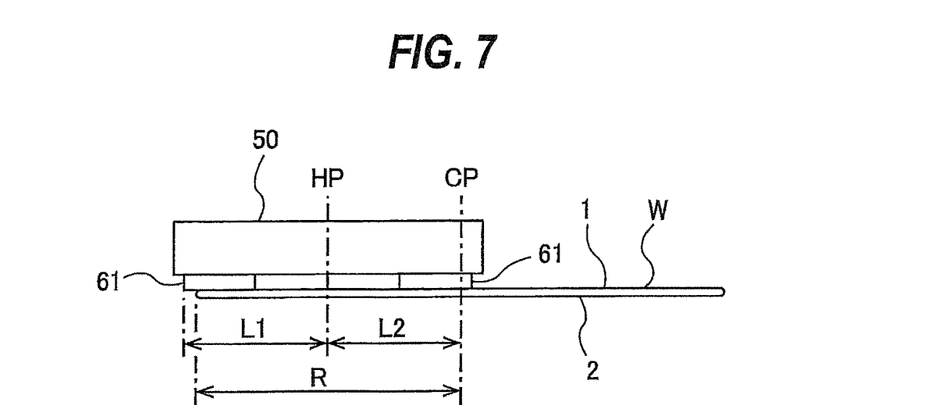
FIG. 7 is a side view showing the arrangement of the polishing head.

FIG. 6 is a plan view showing the arrangement of the polishing head 50, and FIG. 7 is a side view showing the arrangement of the polishing head 50. The rollers 11a are disposed around the axis CP of the substrate holder 10 and located at the same distance from the axis CP of the substrate holder 10. When the wafer W is held by the rollers 11, the central point of the wafer W lies on the axis CP of the substrate holder 10.

The polishing head 50 has a diameter larger than a radius R of the wafer W. The axis (indicated by symbol HP) of the polishing head 50 is out of alignment with the axis CP of the substrate holder 10. Thus, the polishing head 50 is eccentric with respect to the wafer W held by the substrate holder 10. Where L1 represents a distance from the axis HP of the polishing head 50 to the outermost edge of each polishing tool 61, and L2 represents a distance from the axis CP of the substrate holder 10 to the axis HP of the polishing head 50, the sum of the distance L1 and the distance L2 is longer than the radius R of the wafer W. Accordingly, as shown in FIGS. 6 and 7, when the polishing head 50 is polishing the first surface 1 of the wafer W, a part of the polishing tool 61 comes outside the periphery of the wafer W held by the rollers 11.

As can be seen in FIGS. 6 and 7, when the polishing head 50 is rotating, the polishing tools 61 can contact a region ranging from the center to the outermost perimeter of the first surface 1 of the wafer W. Therefore, the polishing tools 61 can polish the entirety of the first surface 1 of the wafer W. As a result, there is no need to polish the outermost area of the surface of the substrate with use of an edge polishing apparatus, and hence the number of polishing steps can be reduced. During polishing of the first surface 1 of the wafer W, the positions of the rollers 11, all rotating about their respective own axes, are fixed. Therefore, the rollers 11 do not contact the polishing head 50 even when the polishing tool 61 partly comes outside the periphery of the wafer W.

Figure 8:
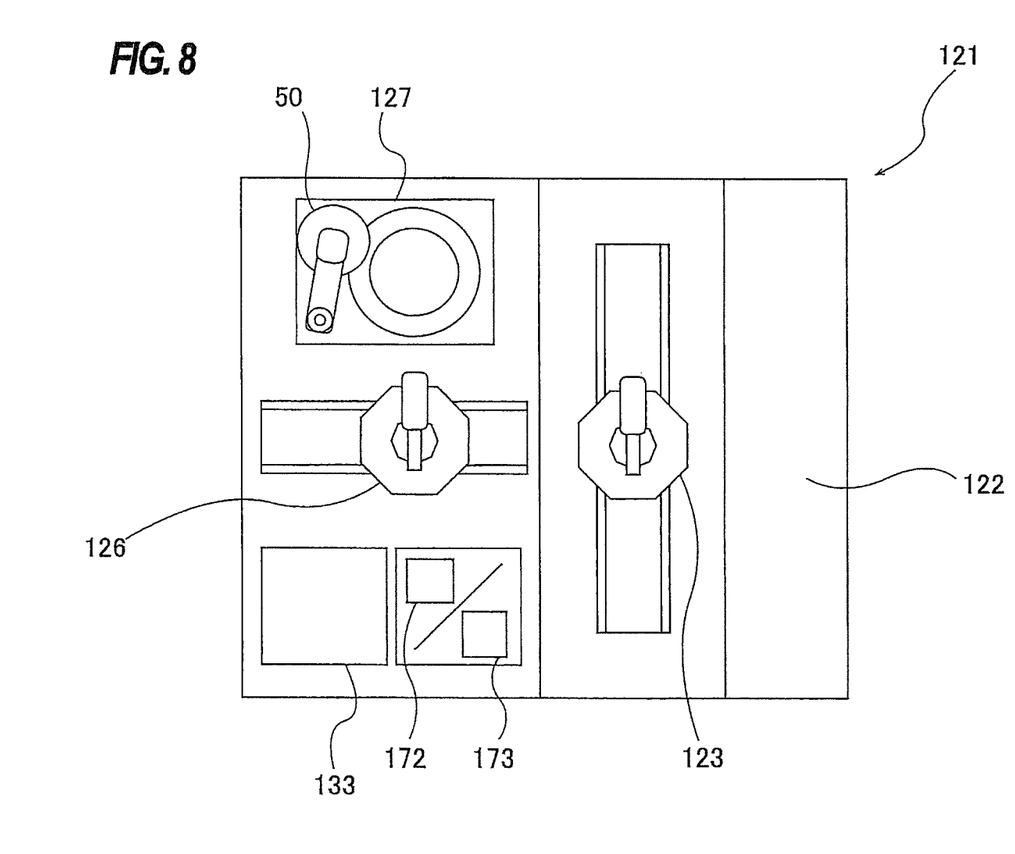
FIG. 8 is a plan view schematically showing an embodiment of a substrate processing system including the polishing apparatus.

FIG. 8 is a plan view schematically showing an embodiment of a substrate processing system including the above-described polishing apparatus. In this embodiment, the substrate processing system includes a loading and unloading section 121 including a front loading section 122 on which a wafer cassette, storing a large number of wafers therein, is placed. An open cassette, a SMIF (Standard Manufacturing Interface) pod, or a FOUP (Front Opening Unified Pod) can be placed on the front loading section 122. The SMIF and the FOUP are each an airtight container which can house a wafer cassette therein and which, by covering it with a partition wall, can keep its internal environment independent of the external environment.

A first transfer robot (or a loader) 123 is disposed in the loading and unloading section 121. This first transfer robot 123 is movable along an arrangement direction of the front loading section 122. The first transfer robot 123 can access the wafer cassette mounted on the front loading section 122 and can take a wafer out of the wafer cassette.

The substrate processing system further includes a second transfer robot 126 which is movable in a horizontal direction, a polishing apparatus 127, a system controller 133 for controlling an overall operation of the substrate processing system, a cleaning unit 172 for cleaning a polished wafer, and a drying unit 173 for drying a cleaned wafer. The cleaning unit 172 and the drying unit 173 may be arranged along the vertical direction. The polishing apparatus 127 is the above-described polishing apparatus shown in FIG. 1.

A wafer in the wafer cassette is transported by the first transfer robot 123 to the polishing apparatus 127, where the surface of the wafer is polished. After completion of the polishing of the wafer, the polishing head 50 is moved to a retreat position. The wafer is removed from the polishing apparatus 127 by the second transfer robot 126, and is transported to the cleaning unit 172. In one embodiment, the cleaning unit 172 includes an upper roll sponge and a lower roll sponge disposed such that the wafer is sandwiched between these two roll sponges, and is configured to clean both surfaces of the wafer with the roll sponges while supplying a cleaning liquid to both surfaces of the wafer.

The cleaned wafer is transported by the second transfer robot 126 to the drying unit 173. In one embodiment, the drying unit 173 is configured to spin-dry the wafer by rotating the wafer about its axis at a high speed. The dried wafer is then returned to the wafer cassette on the front loading section 122 by the first transfer robot 123. In this manner, the substrate processing system can perform a sequence of processes: polishing of the wafer; cleaning of the wafer; and drying of the wafer.

Referring back to FIG. 1, the hydrostatic support stage 90 is one embodiment of a substrate support stage for supporting the second surface 2 (opposite from the first surface 1) of the wafer W held by the rollers 11. In this embodiment, the hydrostatic support stage 90 is configured to bring a fluid into contact with the second surface 2 of the wafer W, held by the rollers 11, so as to support the wafer W with the fluid. The hydrostatic support stage 90 has a substrate support surface 91 to be located close to the second surface 2 of the wafer W held by the rollers 11. Further, the hydrostatic support stage 90 has a plurality of fluid ejection openings 94 formed in the substrate support surface 91, and a fluid supply passage 92 connected to the fluid ejection openings 94. The hydrostatic support stage 90 is disposed under the wafer W held by the substrate holder 10, with the substrate support surface 91 being spaced slightly apart from the second surface 2 of the wafer W. The fluid supply passage 92 is coupled to a not-shown fluid supply source. The substrate support surface 91 of this embodiment has a circular shape, while the substrate support surface 91 may have a square shape or other shape.

The hydrostatic support stage 90 supplies a fluid (e.g. a liquid, such as pure water) to the fluid ejection openings 94 through the fluid supply passage 92 to fill a space between the substrate support surface 91 and the second surface 2 of the wafer W with the fluid. The wafer W is supported by the fluid present between the substrate support surface 91 and the second surface 2 of the wafer W. The wafer W and the hydrostatic support stage 90 are kept out of contact, with a clearance between the wafer W and the hydrostatic support stage 90 being in a range of 50 µm to 500 µm.

The hydrostatic support stage 90 can support the second surface 2 of the wafer W via the fluid in a non-contact manner. Therefore, in a case where devices are formed on the second surface 2 of the wafer W, the hydrostatic support stage 90 can support the wafer W without damage to the devices. The fluid for use in the hydrostatic support stage 90 may be a liquid, such as pure water, which is an incompressible fluid, or a gas, such as air or nitrogen gas, which is a compressible fluid. In the case of using pure water, a pure water supply line, provided in a factory in which the polishing apparatus is installed, can be used as the fluid supply source coupled to the fluid supply passage 92.

The lower surface (i.e., the polishing surface) of the polishing head 50 and the substrate support surface 91 of the hydrostatic support stage 90 are arranged concentrically. Further, the lower surface of the polishing head 50 and the substrate support surface 91 of the hydrostatic support stage 90 are disposed symmetrically with respect to the wafer W. Specifically, the lower surface of the polishing head 50 and the substrate support surface 91 of the hydrostatic support stage 90 are arranged such that the wafer W is interposed between them. The load applied from the polishing head 50 to the wafer W is supported by the hydrostatic support stage 90 located just below the polishing head 50. Therefore, the polishing head 50 can apply a large load to the first surface 1 of the wafer W without causing significant warping of the wafer W being supported by the fluid pressure.

The polishing head 50 may preferably be disposed such that an edge of its lower surface lies on the center of the wafer W. The diameter of the lower surface of the polishing head 50 may preferably be equal to or larger than the radius of the wafer W. In this embodiment, the diameter of the substrate support surface 91 is larger than the diameter of the lower surface of the polishing head 50. In one embodiment, the diameter of the substrate support surface 91 may be equal to or smaller than the diameter of the lower surface of the polishing head 50.

The operation of the polishing apparatus will now be described. The wafer W to be polished is held, with the first surface 1 facing upward, by the rollers 11 of the substrate holder 10, and is rotated about its axis. The fluid (e.g., a liquid such as pure water) is supplied through the fluid supply passage 92 to the fluid ejection openings 94 to fill the space between the substrate support surface 91 and the second surface 2 of the wafer W. The wafer W is supported by the fluid flowing in the gap between the substrate support surface 91 and the second surface 2 of the wafer W.

The rinsing-liquid supply nozzle 27 supplies the rinsing liquid to the center of the wafer W, and the rinsing liquid spreads over the first surface 1 of the wafer W due to the centrifugal force of the rotating wafer W. The head-rotating mechanism 58 rotates the polishing head 50 about its axis HP in the same direction as the wafer W. The air cylinder 57 presses the rotating polishing head 50 against the first surface 1 of the wafer W. The polishing head 50 rubs the polishing tools 61 against the first surface 1 of the wafer W in the presence of the rinsing liquid on the first surface 1, thereby polishing the first surface 1.

As shown in FIGS. 1 and 6, a particle counter 70 is disposed adjacent to the polishing head 50. The particle counter 70 is configured to be capable of sucking in (collecting) the rinsing liquid that has been supplied to the first surface 1 of the wafer W, and measuring the number of particles contained in the rinsing liquid. The particle counter 70 has a suction nozzle 71, and is configured to suck in the rinsing liquid from the first surface 1 of the wafer W through the suction nozzle 71.

A distal end of the suction nozzle 71 is located just above the first surface 1 of the wafer W held by the substrate holder 10. The distal end of the suction nozzle 71 is located more outwardly than a distal end of the rinsing-liquid supply nozzle 27. More specifically, a distance from the axis CP of the substrate holder 10 to the distal end of the suction nozzle 71 is longer a distance from the axis CP of the substrate holder 10 to the distal end of the rinsing-liquid supply nozzle 27. Accordingly, the rising liquid supplied from the rinsing-liquid supply nozzle 27 flows radially outwardly on the wafer W and comes into contact with the polishing tools 61, and a part of the rinsing liquid is sucked into the suction nozzle 71. In this embodiment, the distal end of the suction nozzle 71 is located close to the periphery of the wafer W held by the substrate holder 10.

In the above-described embodiments, a device wafer or a glass substrate, for example, can be used as a substrate to be processed. Further, substrates of various sizes can be processed. For example, it is possible to process wafers having a diameter of 100 mm, 150 mm, 200 mm, 300 mm, and 450 mm. It is also possible to process a large-sized glass substrate.

Figure 9:
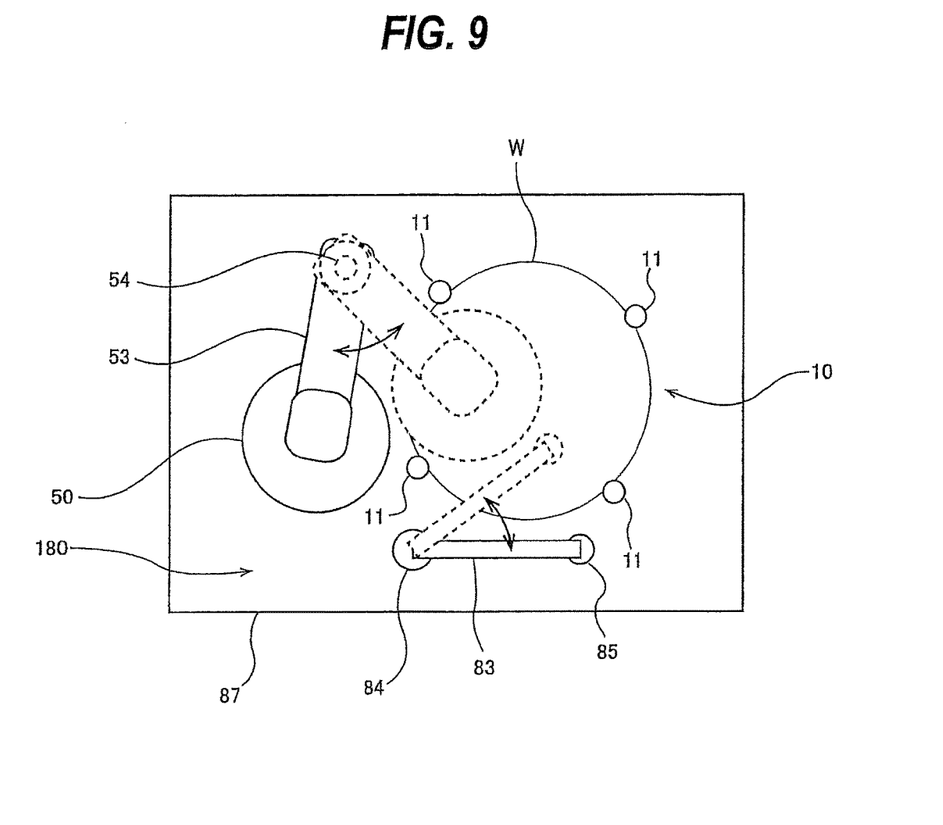
FIG. 9 is a plan view schematically showing another embodiment of the polishing apparatus.

FIG. 9 is a plan view schematically showing another embodiment of the polishing apparatus. The polishing apparatus of this embodiment has a partition wall 87. The polishing head 50, the substrate holder 10 and a cleaning nozzle 85 are disposed in a processing chamber 180 surrounded by the partition wall 87. The polishing head 50 is coupled to one end of a pivot arm 53, while the other end of the pivot arm 53 is secured to a pivot shaft 54. When the pivot shaft 54 is driven by a not-shown shaft rotating mechanism, the polishing head 50 is moved through the pivot arm 53 between a processing position shown by dotted lines and a retreat position located radially outwardly of the wafer W, shown by solid lines. A not-shown polishing-head elevating mechanism for vertically moving the polishing head 50 is coupled to the pivot shaft 54. The polishing-head elevating mechanism moves the polishing head 50 up and down through the pivot shaft 54 and the pivot arm 53. During polishing, the polishing head 50 is lowered by the polishing-head elevating mechanism until it comes into contact with the surface of the wafer W. An air cylinder or a combination of a servo motor and a ball screw mechanism, for example, can be used as the polishing-head elevating mechanism.

The cleaning nozzle 85 is coupled to one end of a nozzle arm 83, while the other end of the nozzle arm 83 is secured to a nozzle arm shaft 84. When the nozzle arm shaft 84 is driven by a not-shown shaft rotating mechanism, the cleaning nozzle 85 is moved through the nozzle arm 83 between a processing position shown by dotted lines and a retreat position located radially outwardly of the wafer W, shown by solid lines. When the cleaning nozzle 85 is in the processing position, a cleaning liquid is supplied from the cleaning nozzle 85 to the surface of the wafer W to clean the surface of the wafer W. Also in this embodiment, the particle counter 70 may be provided close to and above or below the polishing head 50. The substrate holder 10 shown in FIG. 9 is configured to hold the wafer W with a plurality of rollers 11. This configuration enables a not-shown polishing tool(s), mounted to the polishing head 50, to polish the entire first surface, including its outermost area, of the wafer W. It therefore becomes possible to eliminate the step of subsequently polishing the outermost area of the surface of the wafer W by using a separate edge polishing apparatus.

In one embodiment, the rinsing liquid that has been supplied to the substrate on the substrate support stage is discharged through a drain provided below the polishing apparatus, and is collected in a not-shown waste tank. In that case, instead of providing the particle counter 70 close to and above or below the polishing head 50, the number of particles contained in the waste liquid collected in the waste tank may be monitored to detect the end point of polishing.

The previous description of embodiments is provided to enable a person skilled in the art to make and use the present invention. Moreover, various modifications to these embodiments will be readily apparent to those skilled in the art, and the generic principles and specific examples defined herein may be applied to other embodiments. Therefore, the present invention is not intended to be limited to the embodiments described herein but is to be accorded the widest scope as defined by limitation of the claims.

What is claimed is:

1. An apparatus comprising:
   a substrate holder configured to hold a substrate and rotate the substrate about an axis of the substrate holder, the substrate holder including a plurality of rollers which can contact a periphery of the substrate and are rotatable about their respective own axes; and
   a polishing head configured to rub a polishing surface of a polishing tool against a first surface of the substrate to polish the first surface,
   wherein a sum of a distance from an axis of the polishing head to an outermost edge of the polishing surface of the polishing tool and a distance from the axis of the substrate holder to the axis of the polishing head is longer than a radius of the substrate.

2. The apparatus according to claim 1, further comprising:
   a roller-rotating mechanism configured to rotate the plurality of rollers about their respective own axes.

3. The apparatus according to claim 1, further comprising:
   a substrate support stage configured to support a second surface of the substrate, the second surface being opposite from the first surface.

4. The apparatus according to claim 1, further comprising:
   a rinsing-liquid supply nozzle configured to supply a rinsing liquid to the first surface of the substrate;
   a particle counter configured to collect the rinsing liquid that has been supplied to the first surface of the substrate and measure the number of particles contained in the rinsing liquid; and
   an operation controller configured to determine an end point of polishing of the first surface of the substrate based on the number of particles.

5. The apparatus according to claim 4, wherein the end point of polishing is a point at which the number of particles becomes lower than a threshold value.

6. The apparatus according to claim 1, wherein the sum of the distance from the axis of the polishing head to the outermost edge of the polishing surface of the polishing tool and the distance from the axis of the substrate holder to the axis of the polishing head is shorter than a diameter of the substrate.

7. The apparatus according to claim 1, wherein the sum of the distance from the axis of the polishing head to the outermost edge of the polishing surface of the polishing tool and the distance from the axis of the substrate holder to the axis of the polishing head is longer than a distance from the axis of the substrate holder to a clamp portion of one of the plurality of the rollers.

8. The apparatus according to claim 7, wherein the sum of the distance from the axis of the polishing head to the outermost edge of the polishing surface of the polishing tool and the distance from the axis of the substrate holder to the axis of the polishing head is shorter than twice the distance from the axis of the substrate holder to the clamp portion of one of the plurality of rollers.

9. The apparatus according to claim 1, wherein the outermost edge of the polishing surface of the polishing tool is rotatable around the axis of the polishing head.

10. The apparatus according to claim 1, wherein the polishing tool is one of polishing tools held by the polishing head, the polishing tools being arranged around the axis of the polishing head.

11. A method comprising:
    rotating a substrate about an axis of a substrate holder by rotating a plurality of rollers about their respective own axes while keeping the plurality of rollers in contact with a periphery of the substrate, the substrate holder having the plurality of rollers; and
    polishing a first surface of the substrate by rubbing a polishing surface of a polishing tool against the first surface, the polishing tool being held by a polishing head,
    wherein a sum of a distance from an axis of the polishing head to an outermost edge of the polishing surface of the polishing tool and a distance from the axis of the substrate holder to the axis of the polishing head is longer than a radius of the substrate.

12. The method according to claim 11, wherein during polishing of the first surface of the substrate, a part of the polishing surface of the polishing tool comes outside the periphery of the substrate.

13. The method according to claim 11, wherein a second surface of the substrate, opposite from the first surface, is supported during polishing of the first surface of the substrate.

14. The method according to claim 11, wherein polishing the first surface comprises polishing the first surface of the substrate by rubbing the polishing surface of the polishing tool against the first surface while supplying a rinsing liquid to the first surface, and
    wherein the method further comprises:
    collecting the rinsing liquid that has been supplied to the first surface of the substrate;
    measuring the number of particles contained in the rinsing liquid; and
    determining an end point of polishing of the first surface of the substrate based on the number of particles.

15. The method according to claim 14, wherein the end point of polishing is a point at which the number of particles becomes lower than a threshold value.

16. The method according to claim 11, wherein the sum of the distance from the axis of the polishing head to the outermost edge of the polishing surface of the polishing tool and the distance from the axis of the substrate holder to the axis of the polishing head is shorter than a diameter of the substrate.

17. The method according to claim 11, wherein the outermost edge of the polishing surface of the polishing tool is rotatable around the axis of the polishing head.

18. The method according to claim 11, wherein the polishing tool is one of polishing tools held by the polishing head, the polishing tools being arranged around the axis of the polishing head.

* * * * *